(12) United States Patent  (10) Patent No.: US 6,189,121 B1
Ogawa  (45) Date of Patent: Feb. 13, 2001

(54) SEMICONDUCTOR DEVICE CONTAINING A SELF-TEST CIRCUIT

(75) Inventor: Tadahiko Ogawa, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 08/766,962

(22) Filed: Dec. 16, 1996

(30) Foreign Application Priority Data

Dec. 15, 1995 (JP) .................................................. 7-347708

(51) Int. Cl.⁷ .................................................. G01R 31/28
(52) U.S. Cl. .......................................... 714/733; 714/734
(58) Field of Search .................................. 371/22.5, 22.6; 714/733, 734

(56) References Cited

U.S. PATENT DOCUMENTS

| 4,635,261 | * | 1/1987 | Anderson et al. | 371/25.1 |
| 5,502,732 | * | 3/1996 | Arroyo et al. | 371/22.1 |
| 5,515,383 | * | 5/1996 | Katoozi | 371/22.4 |
| 5,631,910 | | 5/1997 | Nozuyama et al. | 714/724 |

FOREIGN PATENT DOCUMENTS

| 1-277782 | 11/1989 | (JP) . |
| 3-114074 | 11/1991 | (JP) . |
| 4-320981 | 11/1992 | (JP) . |
| 6-186299 | 7/1994 | (JP) . |
| 6-201789 | 7/1994 | (JP) . |

OTHER PUBLICATIONS

Williams et al., "Design for Testability—A Survey", Proceedings of the IEE, vol. 71(1):98–112, (1983).

* cited by examiner

Primary Examiner—Emmanuel L. Moise
(74) Attorney, Agent, or Firm—Foley & Lardner

(57) ABSTRACT

A semiconductor device having a self-test circuit which has an input signal generating circuit for generating a test signal in synchronization with a prescribed clock signal, a selector circuit for switching between a test mode for testing and a general normal mode and supplying the test signal generated by the input signal generating circuit to the tested circuit in the test mode, a divider circuit for obtaining the output signal from the tested circuit in response to the test signal, a latch circuit for well-timed extraction of the output signal of the tested circuit obtained by testing means, and a comparator for obtaining the output signal of the tested circuit from the latch circuit and comparing it with a prescribed expected value to evaluate.

13 Claims, 6 Drawing Sheets

SEMICONDUCTOR DEVICE CONTAINING A SELF-TEST CIRCUIT

BACKGROUND OF THE INVENTION

1. Field of the Invention

The invention relates to a semiconductor device containing a self-test circuit, and particularly to a semiconductor circuit for self-testing a tested circuit for a dynamic failure, for example, an out-of-tolerance propagation delay of the tested circuit.

2. Description of the Related Art

A built-in self-test ("BIST") method is a test technique in which a device for testing a part or all of a semiconductor integrated device is mounted upon the pertinent semiconductor integrated device. Details of the BIST method are disclosed in literature such as "Built-In Self-Test Techniques" and "Built-In Self-Test Structures" (IEEE Design & Test of Computers, Vol. 2, No. 2, April 1985, pp 21–36, Edward J. McCluskey). Also, a conventional semiconductor device provided with a self-test circuit, which is not directly relevant to the present invention, is disclosed in Japanese Patent Laid-Open Publication (Kokai) No. Heisei 1-277782. This publication discloses the elimination of the need for an output terminal for testing. This is done by judging the occurrence of a failure in a semiconductor device that is provided with a self-test circuit based on a change in a power source current due to an automatic short-circuit of the power source when the failure has occurred.

FIG. 5 shows the basic configuration of a conventional semiconductor device having a BIST device. In FIG. 5, the semiconductor device has a tested circuit 130 that is a part for performing the primary processing in the pertinent semiconductor device and subjected to the test by the BIST method and a group of circuits for testing.

A selector circuit 120 receives a test signal from an input signal generating circuit 110 and a normal signal from a normal input terminal "IN". The selector circuit 120 selectively provides an output to the tested circuit 130 in response to the logical values "1" and "0" of a signal "TEST" that is supplied to a test/normal mode switching signal terminal "TEST". A divider circuit 140 receives an output signal from the tested circuit 130, and selectively switches between the extraction of the test signal and the output of a normal signal from a normal output terminal "OUT," in response to logical values "1" and "0" of the signal "TEST," in the same way as the selector circuit 120. For example, when the normal signal is supplied from the selector circuit 120 to the tested circuit 130 in response to the logical value "0" of the signal "TEST", the divider circuit 140 outputs, from the normal output terminal "OUT," the output of the normal signal from the tested circuit 130. When the test signal is supplied from the selector circuit 120 to the tested circuit 130, the divider circuit 140 extracts the output of the test signal from the tested circuit 130.

The input signal generating circuit 110 generates a spatially and temporally predefined test signal in synchronization with a clock signal to be supplied to a synchronizing clock input signal terminal "CLOCK". Here, the meaning of spatially predefined is that the number of signals to be generated at the same time is defined. Also, the meaning of temporally defined is that the number of signals which can be generated in a specified time sequence is defined.

An output signal compression circuit 150 compresses a time series output signal resulting from the testing operation by the tested circuit 130 in synchronization with the clock signal to be supplied to the synchronizing clock input signal terminal "CLOCK".

An output signal expected value generating circuit 160 generates an expected value for the response output from the tested circuit 130, with respect to the test signal based upon the input signal generating circuit 110. However, the output signal expected value generating circuit 160 generates a compressed value of the pertinent expected value in accordance with the output from the output signal compression circuit 150. The compressed value output of the expected value is compared, by a comparator 170, with a compressed signal output as the test result from the output signal compression circuit 150. A judged result is then output through a judged value output signal terminal "JUDGE". By reading the judged result, it can be judged whether or not the tested circuit 130 is good.

FIG. 6 is a time chart showing wave forms of the conventional BIST device when in the test mode shown in FIG. 5. The following description of the operation of the conventional BIST device is made with reference to FIG. 6.

A synchronizing clock signal with a cycle "T" is applied to the synchronizing clock input signal terminal "CLOCK", and the wave forms shown in FIG. 6 are for about one cycle.

First, a test signal is generated by the input signal generating circuit 110 in response to the leading edge of a synchronizing clock signal. This test signal is supplied to a joint "a," namely the input terminal of the tested circuit 130, after a delay time {tla} through the selector circuit 120. This is because the output from the input signal generating circuit 110 is selected by the selector circuit 120 in the test mode.

Then, as the response by the tested circuit 130 to the test signal, a test result signal is output after a propagation delay {tab} from a joint "b", namely the output terminal from the tested circuit 130. The test result signal is further supplied to a joint "c", namely the input terminal of the output signal compression circuit 150, after a delay time {tbc} through the divider circuit 140.

Next, the test result signal is delayed for a setup time {tsetup}, and compressed by the output signal compression circuit 150 in response to the leading edge of the synchronizing clock signal of the next cycle. Then after a delay time {tsd}, the signal is output from a joint "d", namely the output of the output terminal signal compression circuit 150.

A sum of a duration of the above-described conventional BIST device, that begins with the leading edge of the synchronizing clock signal with the cycle "T" that is supplied to the synchronizing clock input signal terminal "CLOCK", continuing through the duration of the propagation of the test result signal to the input terminal of the output signal compression circuit 150, namely joint "c," and continuing until a setup time is reached, that shall be kept with respect to the leading edge of the synchronizing clock signal of the next cycle "T" to compress the pertinent test result signal by the output signal compression circuit 150, is represented by the following mathematical expression (hereinafter "expression") (1):

$$\{tla\}+\{tab\}+\{tbc\}+\{tsetup\} \tag{1}$$

The propagation delay {tab} of the tested circuit 130 generally has a large value as compared with other propagation delays such as {tla}, {tbc} and the setup time {tsetup}. Assuming that the tested circuit 130 does not have any static failure such as an open failure or a short-circuit failure, if the cycle "T" of the synchronizing clock signal is given by the following expression (2), the test result is judged to be good, i.e., valid. However, if the cycle "T" of the synchronizing clock signal is given by the following expression (3), the test result is judged to be no good, i.e., it is considered to be not valid:

$$[T] \geq [\{tla\}+\{tab\}+\{tbc\}+\{tsetup\}] \qquad (2)$$

$$[T] < [\{tla\}+\{tab\}+\{tbc\}+\{tsetup\}] \qquad (3)$$

Therefore, the cycle "T" of the synchronizing clock signal is made variable to judge whether the test result is good or defective, so that a dynamic failure in the tested circuit 130 can be evaluated. The dynamic failure in the tested circuit 130 is, for example, an out-of-tolerance failure of a propagation delay.

But, the cycle "T" of the synchronizing clock signal is limited by the performance of the clock signal generating device that is provided outside of the semiconductor device. The cycle "T" is also limited by the performance of a main input buffer through which the semiconductor device first receives a signal from the outside. For example, the cycle of a signal which can be entered into a large-scale integrated logical circuit device of complementary field-effect transistors is in a general range of about ten nanoseconds. On the other hand, the propagation delay of the tested circuit 130 is generally fast as compared with the cycle of a signal which can be entered into the main input buffer. For example, the propagation delay for a random access memory mounted on a gate array, as the subject of the tested circuit, is about several nanoseconds.

Therefore, it is apparent that the conventional BIST device cannot evaluate the above-described dynamic failure.

SUMMARY OF THE INVENTION

A first object of the invention is to provide a semiconductor device with a built-in self-test circuit that has a relatively simple structure, that can judge the presence, or lack thereof, of a dynamic failure in a tested (i.e., testable) circuit. Specifically, it can judge the presence of an out-of-tolerance propagation delay possessed by the tested circuit, and can quantify a propagation delay.

A second object of the invention is to provide a semiconductor device, for example, that can improve the efficiency of developing a gate array. This is done by enabling the device to detect a dynamic failure in a tested circuit having a high-speed propagation delay in a self-test circuit without depending on the frequency of a signal which can be entered into a gate array from outside.

According to one aspect of the invention, a semiconductor device having a tested circuit which is a part for performing the primary process and subject to the test by a built-in self-test method and a group of self-test circuits for testing said tested circuit, wherein the group of self-test circuits comprises:

an input signal generating device for generating a test signal in synchronization with a prescribed clock signal;

a testing device for switching between a test mode for testing and a general normal mode, supplying said test signal generated by said input signal generating device to said tested circuit in the test mode, and obtaining the output signal from said tested circuit in response to said test signal;

a latch device for extracting with specified timing the output signal from said tested circuit obtained by said testing device; and a test result judging device for obtaining the output signal of said tested circuit from said latch device and comparing the output signal with a prescribed expected value for evaluation.

In the preferred construction, the latch device receives and latches a time series output signal resulting from the test by said tested circuit in response to a strobe signal which has the same cycle as said clock signal and a prescribed phase difference with respect to said clock signal.

In the preferred construction, the semiconductor device further comprises a variable delay device for delaying said clock signal for a prescribed delay time to change a phase, and generating a strobe signal, wherein the latch device receives and latches a time series output signal resulting from the test by said tested circuit in response to the strobe signal generated by said variable delay device.

In another preferred construction, the testing device comprises a selector circuit which receives a test signal from the input signal generating device and a normal signal from a normal input terminal, and supplies the test signal in the test mode for testing and the normal signal in the general normal mode to said tested circuit, and a divider circuit which receives the output signal from said tested circuit, supplies the received output signal in the test mode to said latch device, and outputs the received output signal in the normal mode from a normal output terminal.

In another preferred construction, the testing device comprises a selector circuit which receives a test signal from the input signal generating device and a normal signal from a normal input terminal, and supplies the test signal in the test mode for testing and the normal signal in the general normal mode to said tested circuit, and a divider circuit which receives the output signal from said tested circuit, supplies the received output signal in the test mode to said latch device, and outputs the received output signal in the normal mode from a normal output terminal; wherein the latch device receives and latches a time series output signal resulting from the test by said tested circuit in response to a strobe signal which has the same cycle as said clock signal and a prescribed phase difference with respect to said clock signal.

In the preferred construction, the semiconductor device further comprises a variable delay device for delaying said clock signal for a prescribed delay time to change a phase and generating a strobe signal, wherein the testing device comprises a selector circuit which receives a test signal from the input signal generating device and a normal signal from a normal input terminal, and supplies the test signal in the test mode for testing and the normal signal in the general normal mode to said tested circuit, and a divider circuit which receives the output signal from said tested circuit, supplies the received output signal in the test mode to said latch device, and outputs the received output signal in the normal mode from a normal output terminal; and the latch device receives and latches a time series output signal resulting from the test by said tested circuit in response to the strobe signal generated by said variable delay device.

In the above-mentioned construction, the test result judging device comprises an output signal compression device for receiving the output signal from said latch device and compressing the output signal in synchronization with said clock signal, an output signal expected value generating device for generating an expected value for the response output from said tested circuit with respect to the test signal from said input signal generating device, and outputting a compressed value of said expected value in accordance with the output from said output signal compression device, and a comparator device for comparing the compressed value of the expected value from said output signal expected value generating device with a compressed signal as the test result outputted from said output signal compression device.

In the above-mentioned construction, the latch device receives and latches a time series output signal resulting from the test by said tested circuit in response to a strobe signal which has the same cycle as said clock signal and also has a prescribed phase difference with respect to said clock signal; and the test result judging device comprises an output signal compression device for receiving the output signal from said latch device and compressing the output signal in synchronization with said clock signal, an output signal expected value generating device for generating an expected value for the response output from said tested circuit with respect to the test signal from said input signal generating device, and outputting a compressed value of said expected value in accordance with the output from said output signal compression device, and a comparator device for comparing the compressed value of the expected value from said output signal expected value generating device with a compressed signal as the test result outputted from said output signal compression device.

In the preferred construction, the semiconductor device further comprises a variable delay device for delaying said clock signal for a prescribed delay time to change a phase and generating a strobe signal, wherein the latch device receives and latches a time series output signal resulting from the test by said tested circuit in response to the strobe signal generated by said variable delay device; and the test result judging device comprises an output signal compression device for receiving the output signal from said latch device and compressing the output signal in synchronization with said clock signal, an output signal expected value generating device for generating an expected value for the response output from said tested circuit with respect to the test signal from said input signal generating device, and outputting a compressed value of said expected value in accordance with the output from said output signal compression device, and a comparator device for comparing the compressed value of the expected value from said output signal expected value generating device with a compressed signal as the test result outputted from said output signal compression device.

In another preferred construction, the testing device comprises a selector circuit which receives a test signal from the input signal generating device and a normal signal from a normal input terminal, and supplies the test signal in the test mode for testing and the normal signal in the general normal mode to said tested circuit, and a divider circuit which receives the output signal from said tested circuit, supplies the received output signal in the test mode to said latch device, and outputs the received output signal in the normal mode from a normal output terminal; and the latch device receives and latches a time series output signal resulting from the test by said tested circuit in response to a strobe signal which has the same cycle as said clock signal and a prescribed phase difference with respect to said clock signal; and the test result judging device comprises an output signal compression device for receiving the output signal from said latch device and compressing the output signal in synchronization with said clock signal, an output signal expected value generating device for generating an expected value for the response output from said tested circuit with respect to the test signal from said input signal generating device, and outputting a compressed value of said expected value in accordance with the output from said output signal compression device, and a comparator device for comparing the compressed value of the expected value from said output signal expected value generating device with a compressed signal as the test result outputted from said output signal compression device.

In the preferred construction, the semiconductor device further comprises a variable delay device for delaying said clock signal for a prescribed delay time to change a phase and generating a strobe signal, wherein the testing device comprises a selector circuit which receives a test signal from the input signal generating device and a normal signal from a normal input terminal, and supplies the test signal in the test mode for testing and the normal signal in the general normal mode to said tested circuit, and a divider circuit which receives the output signal from said tested circuit, supplies the received output signal in the test mode to said latch device, and outputs the received output signal in the normal mode from a normal output terminal;

the latch device receives and latches a time series output signal resulting from the test by said tested circuit in response to the strobe signal generated by said variable delay device; and the test result judging device comprises an output signal compression device for receiving the output signal from said latch device and compressing the output signal in synchronization with said clock signal, an output signal expected value generating device for generating an expected value for the response output from said tested circuit with respect to the test signal from said input signal generating device, and outputting a compressed value of said expected value in accordance with the output from said output signal compression device, and a comparator device for comparing the compressed value of the expected value from said output signal expected value generating device with a compressed signal as the test result outputted from said output signal compression device.

Other objects, features and advantages of the present invention will become clear from the detailed description given here below.

BRIEF DESCRIPTION OF THE DRAWINGS

The present invention will be understood more fully from the detailed description given herebelow and from the accompanying drawings of the preferred embodiment of the invention, which, however, should not be taken to limit the invention, but are for explanation and understanding only.

In the drawings.

DESCRIPTION OF THE PREFERRED EMBODIMENTS

Figure 1:
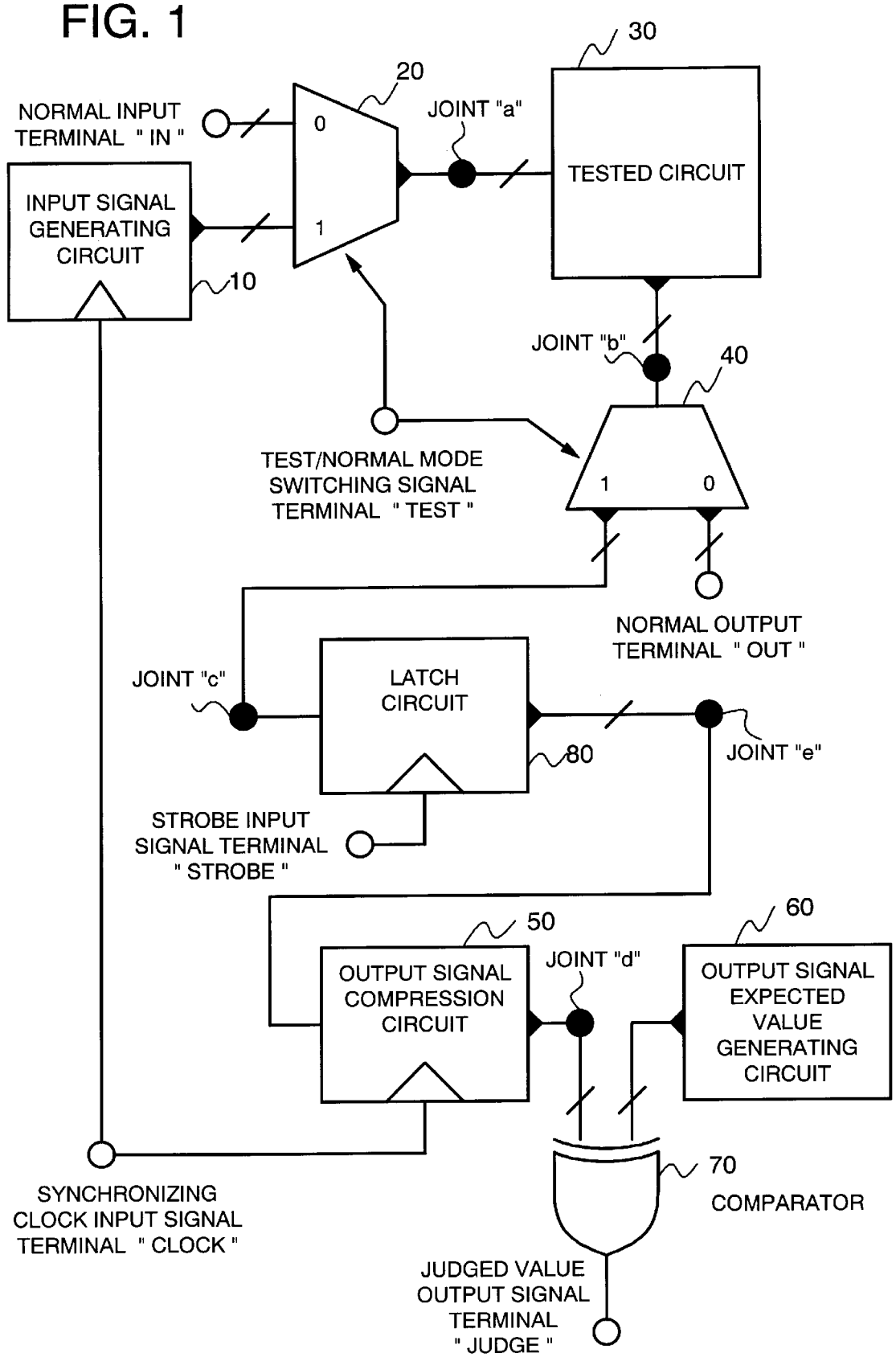
FIG. 1 is a block diagram showing the configuration of a semiconductor device with a built-in self-test circuit according to a first embodiment of the invention.

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to keep from unnecessarily obscuring the present invention.

First, a principle action of the invention will be described in detail.

The invention provides a signal extraction circuit which changes the phase of an output signal from a tested (i.e., testable) circuit in response to an input signal by a phase difference "tΘ" with respect to the pertinent input signal and extracts a signal in synchronization with the pertinent input signal. Thus, the relationship of the following expression (4) can be established:

$$[t\Theta]-[\{tla\}+\{tab\}+\{tbc\}+\{tsetup\}] << 0 \qquad (4)$$

For example, it is assumed that a dynamic failure occurs in the tested circuit, causing a delay of a propagation delay {tab'} which is given by the following expression (5):

$$\{tab'\} >> \{tab\} \qquad (5)$$

In the expression, the propagation delay {tab} of a tested circuit 30 indicates a standard value.

Therefore, a delay relation can be shown by the following expression (6):

$$[t\Theta]-[\{tla\}+\{tab'\}+\{tbc\}+\{tsetup\}] < 0 \qquad (6)$$

As described above, the signal extraction circuit changes the phase of the output signal from the tested circuit having a dynamic failure in response to the input signal by a phase difference "tΘ" with respect to the pertinent input signal and extracts a signal in synchronization with the pertinent input signal, so that the pertinent tested circuit can be judged to be a defective item if the test result satisfies the above expression (6).

FIG. 1 is a block diagram showing the configuration of a semiconductor device with a built-in self-test circuit according to a first embodiment of the invention.

As shown in FIG. 1, the semiconductor device has a tested circuit 30, which has a part for performing the primary process in the pertinent semiconductor device, that is subjected to a test by the BIST method and a group of self-test circuits for testing. FIG. 1 shows only the characteristic configuration of the embodiment with other general elements omitted.

The group of self-test circuits has an input signal generating circuit 10 for generating a test signal, a selector circuit 20 and a divider circuit 40 for switching between a test mode for testing and a general normal mode, a latch circuit 80 for well-timed extraction of the output signal from the tested circuit 30, an output signal compression circuit 50 for obtaining a test result from the output signal of the tested circuit 30, an output signal expected value generating circuit 60, and a comparator 70.

The selector circuit 20 receives a test signal from the input signal generating circuit 10 and a normal signal from a normal input terminal "IN". The selector circuit 20 and supplies the test signal in the test mode for testing, and the normal signal in the general normal mode, to the tested circuit 30. Specifically, it selectively outputs either the received test signal, or the normal signal, to the tested circuit 30 in response to the logical values "1" and "0" of a signal "TEST". The signal "TEST" is supplied to a test/normal mode switching signal terminal "TEST". In the embodiment shown in FIG. 1, when the logical value of the signal "TEST" is "1", the test signal is supplied to the tested circuit 30, and when it is "0", the normal signal is supplied thereto.

The divider circuit 40 receives the output signal from the tested circuit 30. To supply the latch circuit 80, the divider circuit 40 then outputs the test signal in the test mode, and outputs the normal signal in the normal mode from a normal output terminal "OUT". Specifically, in the same way as the selector circuit 20 responds, the output to the latch circuit 80 and the output through the normal output terminal "OUT" are selectively switched according to the logical values "1" and "0" of the signal "TEST". In the embodiment shown in FIG. 1, when the logical value of the signal "TEST" is "1", the test signal is sent to the latch circuit 80, and when the logical value of the signal "TEST" is "0", the normal signal is sent from the normal output terminal "OUT". Specifically, when the normal signal is supplied from the selector circuit 20 to the tested circuit 30, according to a mode specified by the logical value of the signal "TEST", the divider circuit 40 outputs, from the normal output terminal "OUT", the output of the normal signal from the tested circuit 30. However, when the test signal is supplied from the selector circuit 20 to the tested circuit 30, the divider circuit 40 extracts the output test signal from the tested circuit 30.

The input signal generating circuit 10 generates a spatially and temporally predefined test signal in synchronization with a clock signal that is supplied to a synchronizing clock input signal terminal "CLOCK".

The latch circuit 80 receives and latches a time series output signal which is a result from the test operation by the tested circuit 30 in response to a strobe signal that is supplied to a strobe input signal terminal "STROBE". The strobe signal to be entered into the strobe input signal terminal "STROBE" is a signal having the same cycle "T" as the clock signal that is supplied to the synchronizing clock input signal terminal "CLOCK" and a phase difference "tΘ" with respect to the clock signal.

The output signal compression circuit 50 receives the output signal from the latch circuit 80, and compresses it in synchronization with the clock signal that is supplied to the synchronizing clock input signal terminal "CLOCK".

The output signal expected value generating circuit 60 generates an expected value of the output from the tested circuit 30 with respect to the test signal from the input signal generating circuit 10. The generating circuit 60 then outputs a compressed value of the pertinent expected value in accordance with the output from the output signal compression circuit 50.

The comparator 70 compares the compressed value of the expected value from the output signal expected value generating circuit 60 with the compressed signal test result that has been output from the output signal compression circuit 50. Next, a judged result is output through a judged value output signal terminal "JUDGE". By reading the judged result, a determination can be made as to whether or not the tested circuit 30 is normal.

Figure 2:
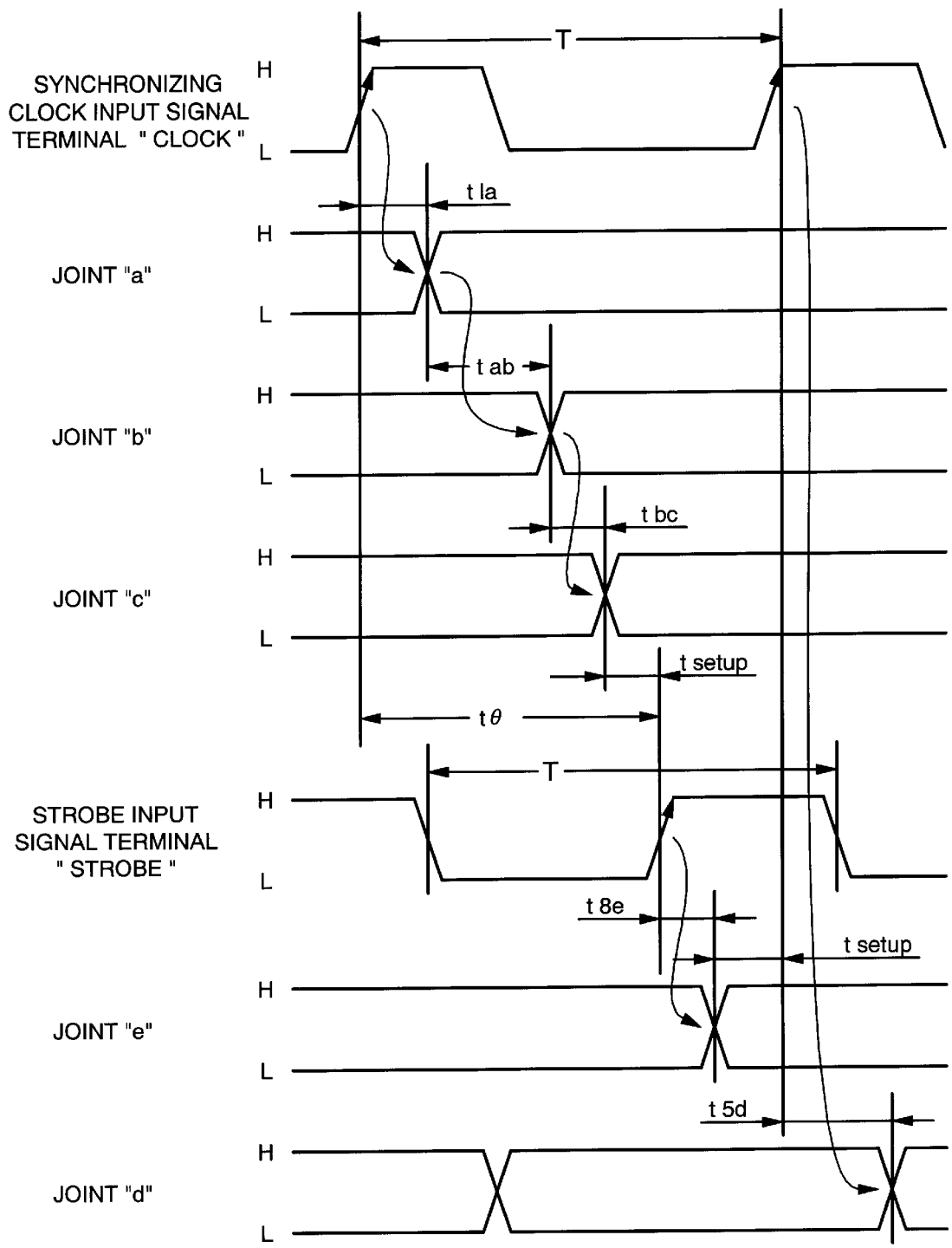
FIG. 2 is a time chart showing the operation 10 of the first embodiment in a test mode.

FIG. 2 is a time chart showing wave forms of the BIST device in the test mode in this embodiment. The operation of this embodiment will now be described with reference to FIGS. 1 and 2.

The synchronizing clock signal having the cycle "T" is applied to the synchronizing clock input signal terminal "CLOCK". The wave forms shown in FIG. 2 are for about one cycle.

In response to the leading edge of the synchronizing clock signal, a test signal is generated by the input signal generating circuit 10. Because the output from the input signal generating circuit 10 is selected in the selector circuit 20 in the test mode, this test signal is supplied to the joint "a", namely the input terminal of the tested circuit 30, after the delay time {tla} through the pertinent selector circuit 20.

Then, a test result signal, that is the response by the tested circuit 30 to the test signal, is output after the propagation delay {tab} from the joint "b", namely the output terminal from the tested circuit 30. The test result signal is then supplied to the joint "c", namely the input terminal of the latch circuit 80, after the delay time {tbc} through the divider circuit 40.

The test result signal is delayed for the setup time {tsetup}. The test result signal is then latched by the latch circuit 80 in response to the leading edge of a strobe signal that is supplied to the strobe input signal terminal "STROBE". A phase difference tΘ from the leading edge of the clock signal to the leading edge of the strobe signal is set to be a minimum value which satisfies the following expression (7):

$$[t\Theta] > [\{tla\}+\{tab\}+\{tbc\}+\{tsetup\}] \quad (7)$$

Then, the test result signal, latched by the latch circuit 80, is supplied to a joint "e", namely the input terminal of the output signal compression circuit 50, after a delay time {t8e}.

The test result signal is further delayed for a setup time {tsetup}. The test result signal is then compressed by the output signal compression circuit 50 in response to the leading edge of the synchronizing clock signal of the next cycle, delayed again for a delay time {tsd}, and then output from a joint "d", namely the output terminal of the output signal compression circuit 50.

According to the BIST device in the above-described embodiment, when a test result that satisfies the following expression (8) is obtained, provided that the tested circuit 30 does not have a static failure such as an open failure or short-circuit failure, the tested circuit 30 is judged to be a good, i.e. not defective, item. On the other hand, when the test result does not satisfy the following expression (8) but satisfies the following expression (9), the tested circuit 30 is judged to be a defective item.

$$\{tab'\} \leq \{tab\} \quad (8)$$

$$\{tab'\} > \{tab\} \quad (9)$$

In the above expressions, the delay time {tab} is a standard value for the propagation delay in the tested circuit 30, and the delay time {tab'} is a specific sample value.

Now, it is assumed that a value "tΘ'" satisfies the following expression (10):

$$[t\Theta'] > [\{tla\}+\{tab'\}+\{tbc\}+\{tsetup\}] \quad (10)$$

A phase difference with respect to the clock signal of a strobe signal that is supplied to the strobe input signal terminal "STROBE" is set to be a minimum phase difference "tΘ'" that satisfies the above expression (10). When the delay time {tab'} satisfies the following expression (11), the relationship shown by the following expression (12) is obtained, and a propagation delay {tab'} of the tested circuit 30 that is an arbitrarily sampled device sample, can be quantified as:

$$[tab'] >> [\{tla\}+\{tbc\}+\{tsetup\}] \quad (11)$$

$$[tab'] \approx [t\Theta'] \quad (12)$$

It can also be assumed that the standard value {tab} for the propagation delay of the tested circuit 30 has the following expression (13):

$$[tab] >> [\{tla\}+\{tbc\}+\{tsetup\}] \quad (13)$$

Therefore, the relation of the following expression (14) can be obtained on the basis of the above expression (7).

$$[tab] \approx [t\Theta] \quad (14)$$

By comparing the minimum phase difference "tΘ'" that satisfies the expression (10) with the minimum phase difference "tΘ" which satisfies the expression (7), the tested circuit 30 can be judged as to whether or not it is good. Specifically, the tested circuit 30 can be judged to be good, i.e. not defective, when the following expression (15) is satisfied, and it can be judged to be a defective item when the following expression (16) is satisfied:

$$[t\Theta'] \leq [t\Theta] \quad (15)$$

$$[t\Theta'] > [t\Theta] \quad (16)$$

Therefore, when this test is performed where the strobe signal that is supplied to the strobe input signal terminal "STROBE" has the same cycle "T" as the clock signal that is supplied to the synchronizing clock input signal terminal "CLOCK", and also has a phase difference between the clock signal and the strobe signal that is the minimum phase difference "tΘ" satisfying the expression (7), it is then possible to detect a dynamic failure, namely an out-of-tolerance failure of a propagation delay or the like, in the tested circuit 30.

Figure 3:
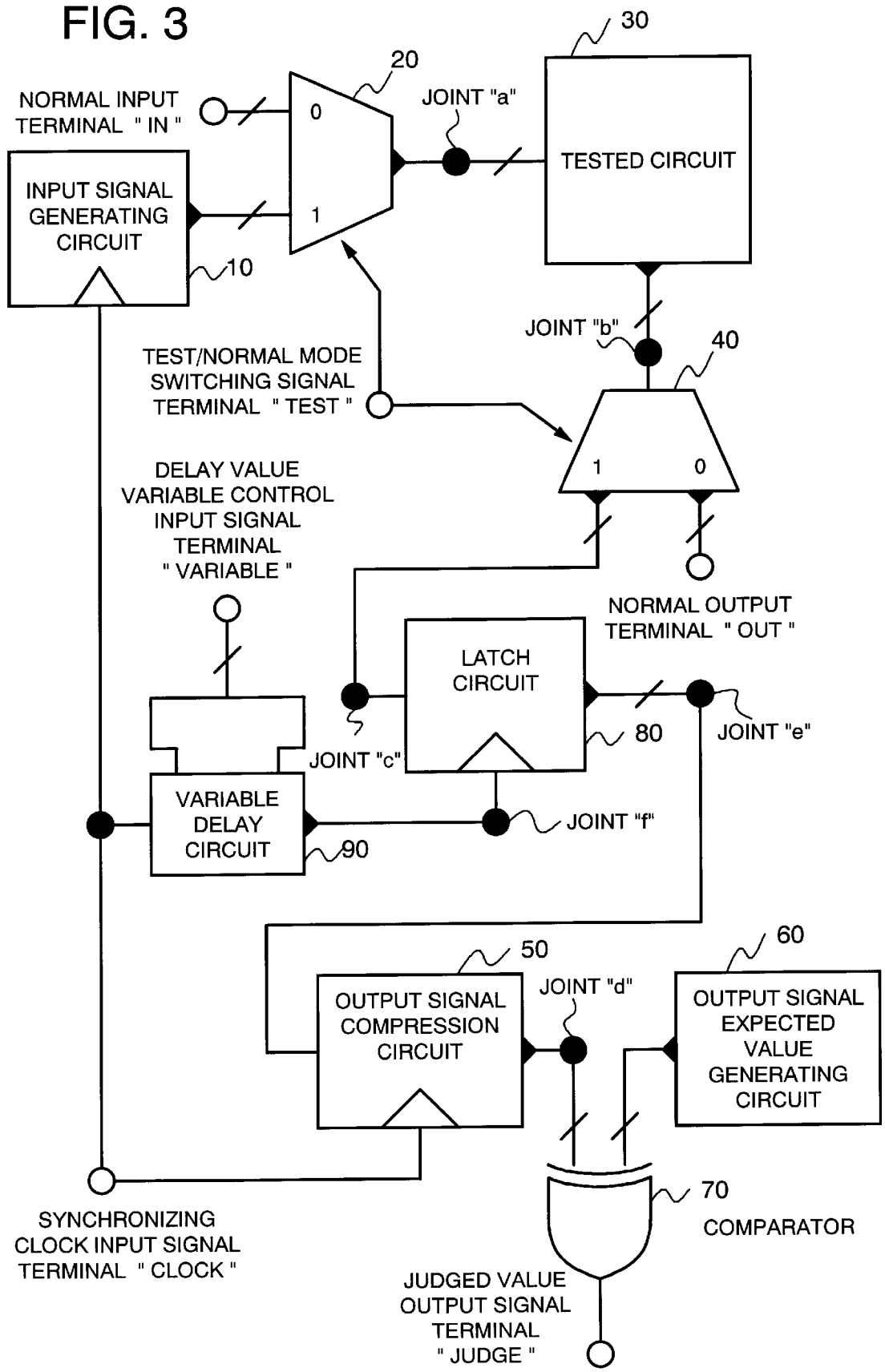
FIG. 3 is a block diagram showing the configuration of a semiconductor device with a built-in self-test circuit according to another embodiment of the invention.

FIG. 3 is a block diagram showing the configuration of a semiconductor device with a built-in 15 self-test circuit according to another embodiment of the invention.

As shown in FIG. 3, the semiconductor device has a tested circuit 30 which is a part for performing the primary process in the pertinent semiconductor device. The tested circuit 30 is subjected to the test by the BIST method and a group of self-test circuits for testing. The group of selftest circuits has an input signal generating circuit 10 for generating a test signal, a selector circuit 20 and a divider circuit 40 for switching between a test mode for testing and a general normal mode, a variable delay circuit 90 and a latch circuit 80 for a well-timed extraction of the output signal from the tested circuit 30, an output signal compression circuit 50 for obtaining a test result from the output signal from the tested circuit 30, an output signal expected value generating circuit 60, and a comparator 70. FIG. 3 shows only the characteristic configuration of this embodiment with other general elements omitted. In the above configuration, the input signal generating circuit 10, the selector circuit 20, the divider circuit 40, the output signal compression circuit 50, the output signal expected value generating circuit 60, the comparator 70 and the latch circuit 80 are the same as those in the first embodiment shown in FIG. 1. Therefore, the same reference numerals are allocated and their descriptions will be omitted.

Figure 4:
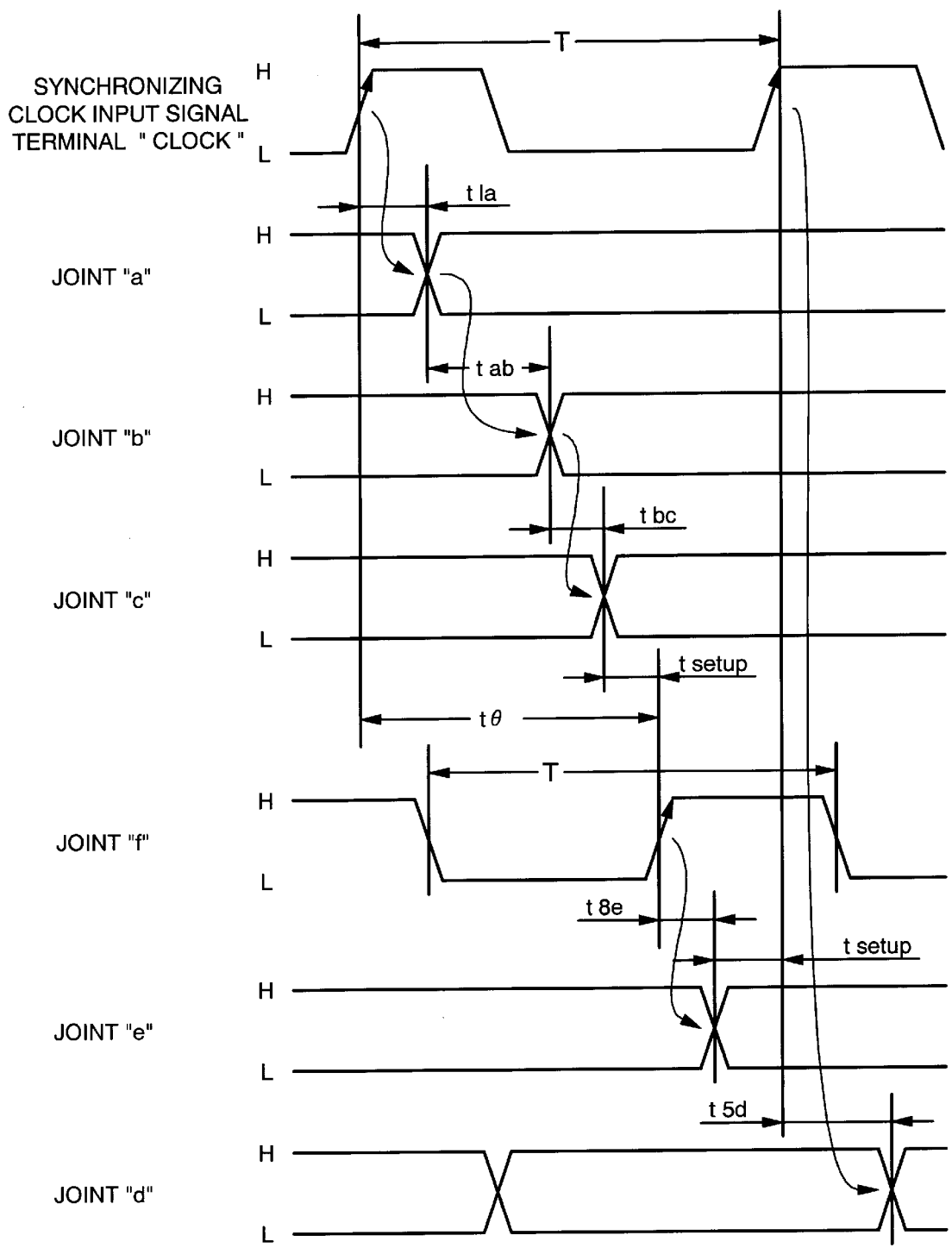
FIG. 4 is a time chart showing the operation of the above embodiment in a test mode.
Figure 5:
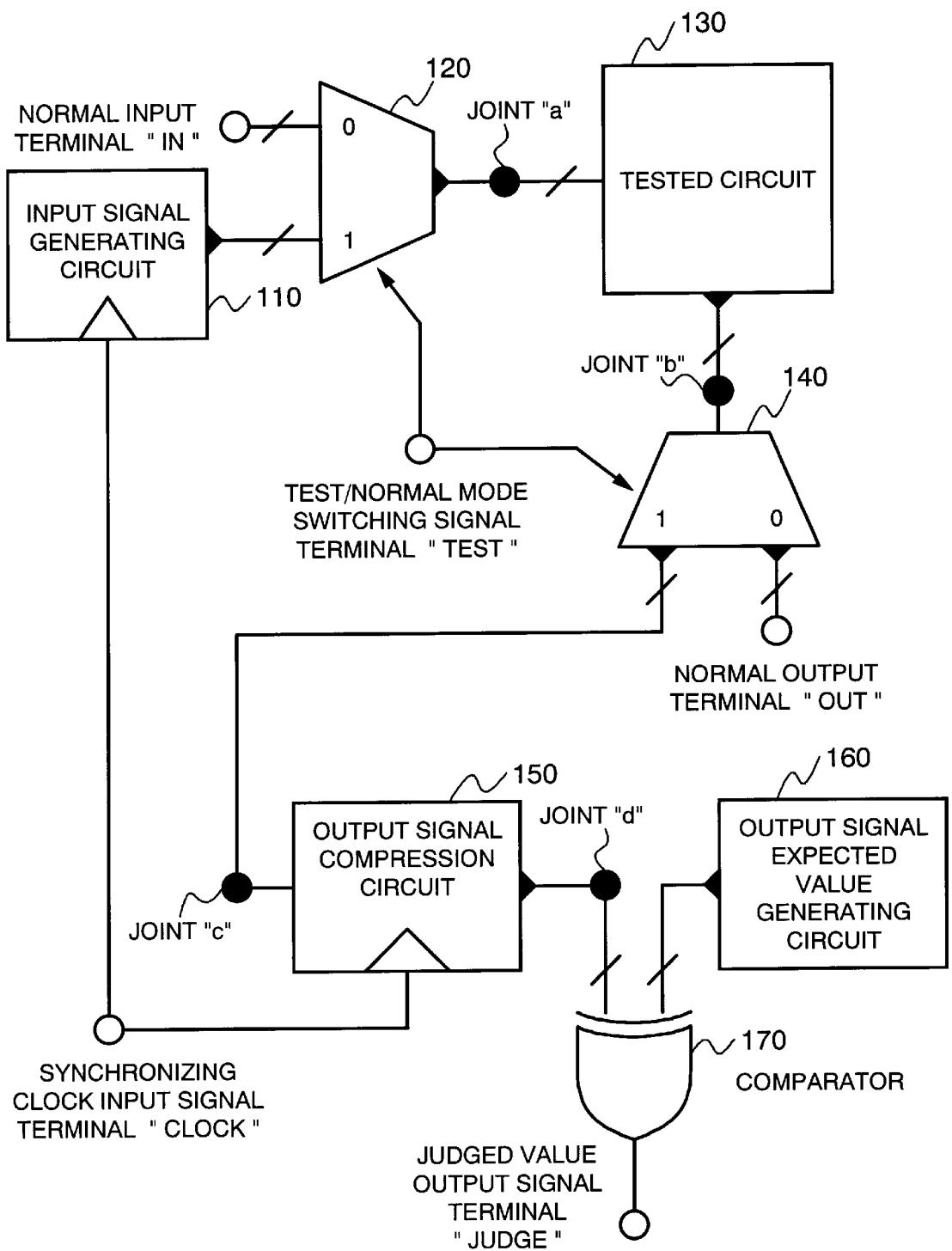
FIG. 5 is a block diagram showing the configuration of a conventional semiconductor device with a built-in self-test circuit.
Figure 6:
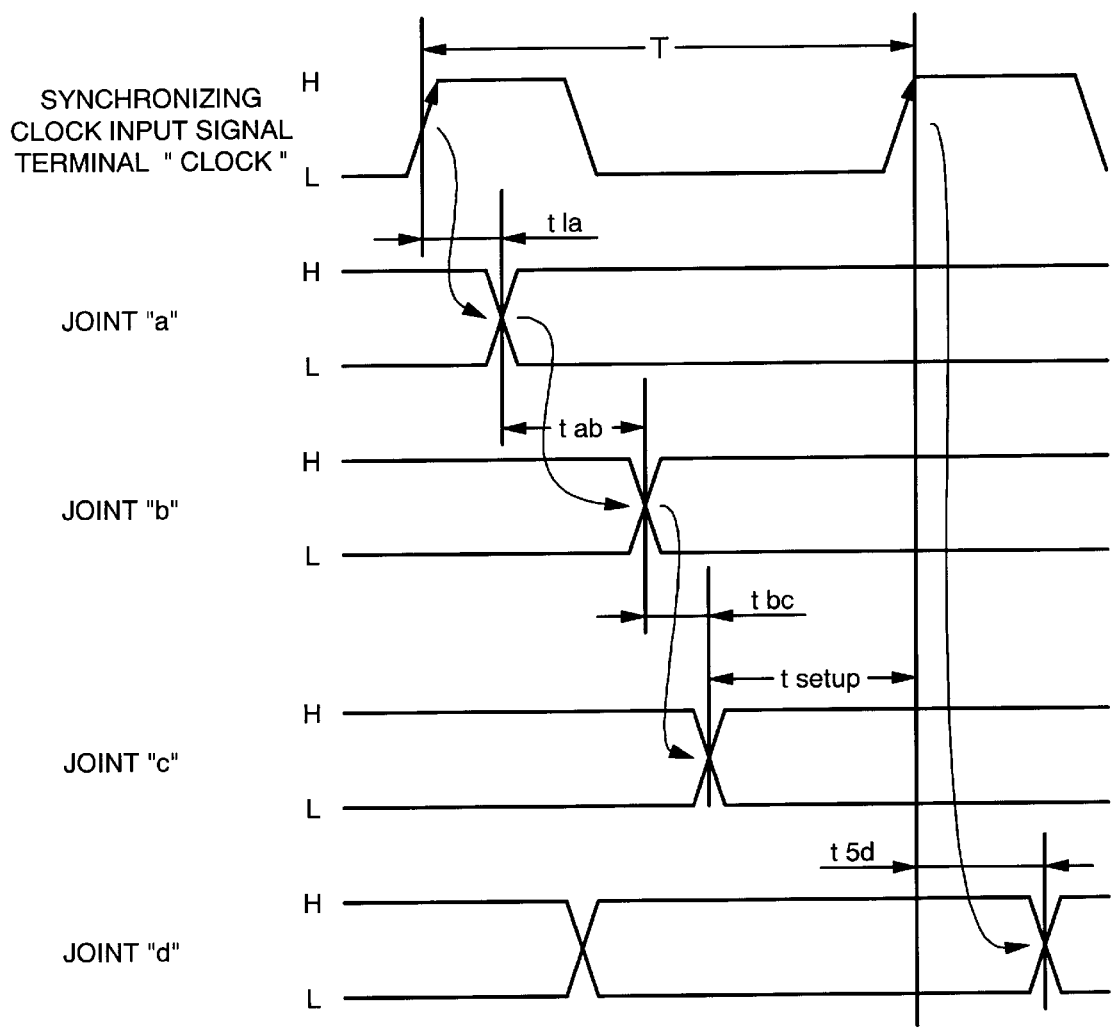
FIG. 6 is a time chart showing the operation of a conventional semiconductor device with a built-in self-test circuit in a test mode.

The variable delay circuit 90 receives a clock signal that is supplied to a synchronizing clock input signal terminal "CLOCK". The variable delay circuit 90 delays it appropriately, and then outputs a strobe signal with a phase change with a phase difference "tΘ". The strobe signal output is then supplied to the latch circuit 80. The delay time in the variable delay circuit 90 can be set as desired by a control signal that is supplied to a delay value variable control input signal terminal "VARIABLE". Therefore, a strobe signal having a desired phase difference with respect to the clock signal can be generated as desired. FIG. 4 shows a time chart showing wave forms of the BIST device in a test mode in this embodiment. The operation of this embodiment will now be described with reference to FIGS. 3 and 4.

A synchronizing clock signal with a cycle "T" is applied to the synchronizing clock input signal terminal "CLOCK". The wave forms shown in FIG. 4 are for about one cycle.

First, a test signal is generated in the input signal generating circuit 10 in response to the leading edge of a synchronizing clock signal. This test signal is supplied to a joint "a", namely the input terminal of the tested circuit 30, after a delay time {tla} through the selector circuit 20. This is because the output from the input signal generating circuit 10 is selected by the selector circuit 20 in the test mode.

Then, a test result signal, as the response by the tested circuit 30 with respect to the test signal, is output at a joint "b", namely the tested circuit 30 output terminal, after a propagation delay {tab}. The test result signal passes through the divider circuit 40 and is then supplied to a joint "c", namely the input terminal of the latch circuit 80, after a delay time {tbc}.

The pertinent test result signal is delayed by a setup time {tsetup}, and latched by the latch circuit 80 in response to the leading edge of the strobe signal that is supplied from the variable delay circuit 90 to a joint "f", namely the latch circuit 80. The strobe signal is generated with the phase of the clock signal that is supplied to the synchronizing clock input signal terminal"CLOCK" changed by a phase difference "tΘ" in the variable delay circuit 90. The phase difference "tΘ" is set to be a minimum value which satisfies the above described expression (7).

Then, the test result signal that is latched by the latch circuit 80 is supplied to a joint "e", namely the input terminal of the output signal compression circuit 50, after a delay time {t8e}.

The test result signal is then delayed by the setup time {tsetup}, and compressed by the output signal compression circuit 50 in response to the leading edge of the cycling clock signal of the next cycle. Next, after a delay time {t5d}, it is output from a joint "d", namely the output terminal of the output signal compression circuit 50.

In using the BIST device in this embodiment of FIGS. 3 and 4, described above, the control signal that is supplied to the delay value variable control input signal terminal "VARIABLE" is managed in the same way as it is in the first embodiment, so that a delay in the variable delay circuit 90. This is namely the value of a phase difference "tΘ'", can be controlled. Accordingly, a quantification can be made by using the phase difference "tΘ'" regardless of whether or not a propagation delay {tab'} of the tested circuit 30, of an arbitrarily sampled device, satisfies the standard value and is above or below the standard value. Therefore, the control signal to be supplied to the delay value variable control input signal terminal "VARIABLE" is set so that the phase difference of the strobe signal, with respect to the clock signal, is the minimum phase difference "tΘ'" satisfying the expression (11). Also, the phase difference "tΘ'" is compared with the phase difference "tΘ" based on the standard value {tab} of the delay time. Thus, it can be judged whether or not the tested circuit 30 is good.

In the first embodiment, the strobe signal that is supplied to the latch circuit 80 was generated outside and then entered through the strobe input signal terminal "STROBE" in synchronization with the synchronizing clock signal. But, in this embodiment, the delay time with respect to the clock signal is determined for the variable delay circuit 90, so that control is facilitated, because the strobe signal is automatically generated based on the pertinent clock signal.

Now, examples of the action of the invention will be described with reference to specific numerical values. In a gate array having a static random access memory ("SRAM") therein, it is assumed that the SRAM has an address access time of 4 nanoseconds on average and a normal distribution of a standard deviation of approximately 1.333 nanoseconds. Also, a production SRAM is determined to have a guaranteed standard value of 8 nanoseconds for the address access time. The address access time of the SRAM is the duration until a stored signal is read from a pertinent address after the determination of the address signal of the SRAM. This corresponds to the propagation delay of the SRAM. On the other hand, a signal which can be entered from outside to the inside of the gate array has a frequency of 100 MHz, namely a cycle time of nanoseconds. The number of semiconductor devices having the standard value for an address access time falling below 8 nanoseconds is about 1,350 parts per million (ppm) in view of the probability. The number of semiconductor devices having an address access time falling below 10 nanoseconds is 3 ppm.

When the conventional BIST device is added to the SRAM, the ability of the SRAM to detect a dynamic failure is restricted by the cycle of a signal that can be entered from the outside of a gate array semiconductor device, namely a time of 10 nanoseconds. Therefore, only semiconductor devices of about 1,347 ppm have the address access time that is larger than the standard value of 8 nanoseconds and smaller than the limit of 10 nanoseconds for detection. Therefore, the conventional BIST cannot reasonably or efficiently detect a dynamic failure, and it is necessary to them by another method.

In this connection, as another method, for example, the BIST is added to a configuration containing 25 an SHAM and a peripheral circuit, electrically correlated with the SRAM, to determine an appearance propagation delay, namely a cycle time in which a dynamic failure can be detected, to be 10 nanoseconds or more. But, to use such a method, the BIST for the SRAM is required to generate a signal series intrinsic for detecting a failure. On the other hand, the other method described above needs to add the electrically correlated peripheral circuit at the front and rear of the SRAM, so that a signal series that would be generated by the BIST becomes more complicated. In such a case, by instead using the BIST device of the present invention, the phase difference "tΘ" of the strobe signal that is entered through the strobe input signal terminal "STROBE" is adjusted (the first embodiment). Alternatively, the control signal that is supplied to the delay value variable control input signal terminal "VARIABLE" is managed in order to adjust the phase difference "tΘ'" of the strobe signal generated by the variable delay circuit 90 (the second embodiment). Either is done so that a dynamic failure in the SRAM can be detected without depending on the frequency of the signal that is entered from the outside to the inside of the gate array. Therefore, unlike the above-described conventional technique, the present invention does not need to introduce another technique, so that needless labors in developing the gate array can be eliminated.

As described above, the semiconductor device with a built-in self-test circuit, according to the present invention, has the benefit that the presence of a dynamic failure in a tested circuit, namely an out-of-tolerance propagation delay possessed by the tested circuit, can be detected and the propagation delay can be quantified in a relatively simple configuration.

Also, the invention has a benefit in that a dynamic failure in a tested circuit having a fast propagation delay can be detected without depending on the frequency of a signal that can be entered from the outside to the inside of the gate array. Therefore, no other configuration or technique is required for the test, and the efficiency of developing a gate array can be improved.

Although the invention has been illustrated and described with respect to the exemplary embodiments thereof, it is understood by those skilled in the art that the foregoing and various other changes, omissions, and additions may be made therein and thereto, without departing from the spirit and scope of the present invention. Therefore, it is understood that the present invention is not limited to the specific embodiments set out above, but includes all possible embodiments which can be embodies within the scope encompassed, and equivalents thereof, with respect to the features set out in the appended claims.

What is claimed is:

1. A semiconductor device having a testable circuit that is subject to a built-in self-test circuit comprising:

an input signal generating means for generating a test signal in synchronization with a clock signal;

a testing means, the testing means providing for switching between a test mode and a normal mode, the testing means supplying said test signal to said testable circuit when in the test mode, and obtaining an output signal from said testable circuit in response to said test signal;

a latch means for extracting, with a specifiable timing, the output signal from said testable circuit that is obtained by said testing means; and a test result judging means for obtaining the output signal of said testable circuit from said latch means and comparing the output signal with an expected value for evaluation.

2. The semiconductor device as set forth in claim 1, wherein said latch means receive and latch a time series output signal resulting from a test by said testable circuit in response to a strobe signal which has the same cycle as said clock signal and a phase difference with respect to said clock signal.

3. The semiconductor device as set forth in claim 1 further comprising:

variable delay means for generating a strobe signal by delaying said clock signal for a delay time, and wherein said latch means receive and latch a time series output signal resulting from a test by said testable circuit in response to the strobe signal generated by said variable delay means.

4. The semiconductor device as set forth in claim 1, further comprising:

a selector circuit which receives said test signal from the input signal generating means and a normal signal from a normal input terminal, and supplies the test signal in the test mode and the normal signal in the normal mode to said testable circuit and, a divider circuit which receives the output signal from said testable circuit, supplies the received output signal in the test mode to said latch means, and outputs the received output signal in the normal mode from a normal output terminal.

5. The semiconductor device as set forth in claim 1, further comprising:

a selector circuit which receives said test signal from the input signal generating means and a normal signal from a normal input terminal, and supplies the test signal in the test mode and the normal signal in the normal mode to said testable circuit, and a divider circuit which receives the output signal from said testable circuit, supplies the received output signal in the test mode to said latch means, and outputs the received output signal in the normal mode from a normal output terminal; wherein said latch means receive and latch a time series output signal resulting from a test by said testable circuit in response to a strobe signal which has the same cycle as said clock signal and a phase difference with respect to said clock signal.

6. The semiconductor device as set forth in claim 1 further comprising:

variable delay means for delaying said clock signal for a delay time to change a phase and generate a strobe signal a selector circuit which receives a test signal from the input signal generating means and a normal signal from a normal input terminal, and supplies the test signal in the test mode and the normal signal in the normal mode to said testable circuit, and a divider circuit which receives the output signal from said testable circuit, supplies the received output signal in the test mode to said latch means, and outputs the received output signal in the normal mode from a normal output terminal; wherein said latch means receive and latch a time series output signal resulting from a test by said testable circuit in response to the strobe signal generated by said variable delay means.

7. The semiconductor device as set forth in claim 1, wherein said test result judging means comprises:

output signal compression means for receiving the output signal from said latch means and compressing the output signal in synchronization with said clock signal, output signal expected value generating means for generating an expected value for the response output from said testable circuit with respect to a test signal from said input signal generating means, and outputting a compressed value of said expected value in accordance with the output from said output signal compression means, and comparator means for comparing the compressed value of the expected value from said output signal expected value generating means with a compressed signal as a test result outputted from said output signal compression means.

8. The semiconductor device as set forth in claim 1, wherein said latch means receive and latch a time series output signal resulting from a test by said testable circuit in response to a strobe signal which has the same cycle as said clock signal and also has a phase difference with respect to said clock signal; and said test result judging means further comprising:
output signal compression means for receiving the output signal from said latch means and compressing the output signal in synchronization with said clock signal,
output signal expected value generating means for generating an expected value for the response output from said testable circuit with respect to the test signal from said input signal generating means, and outputting a compressed value of said expected value in accordance with the output from said output signal compression means, and
comparator means for comparing the compressed value of the expected value from said output signal expected value generating means with a compressed signal as a test result outputted from said output signal compression means.

9. The semiconductor device as set forth in claim 1 further comprising:
variable delay means for delaying said clock signal for a delay time to change a phase and generate a strobe signal, wherein
said latch means receive and latch a time series output signal resulting from the test by said testable circuit in response to the strobe signal generated by said variable delay means; and
said test result judging means further comprising:
output signal compression means for receiving the output signal from said latch means and compressing the output signal in synchronization with said clock signal,
output signal expected value generating means for generating an expected value for the response output from said testable circuit with respect to the test signal from said input signal generating means, and outputting a compressed value of said expected value in accordance with the output from said output signal compression means, and
comparator means for comparing the compressed value of the expected value from said output signal expected value generating means with a compressed signal as a test result outputted from said output signal compression means.

10. The semiconductor device as set forth in claim 1, comprising:
a selector circuit which receives a test signal from the input signal generating means and a normal signal from a normal input terminal, and supplies the test signal in the test mode and the normal signal in the normal mode to said testable circuit, and
a divider circuit which receives the output signal from said testable circuit, supplies the received output signal in the test mode to said latch means, and outputs the received output signal in the normal mode from a normal output terminal; wherein
said latch means receive and latch a time series output signal resulting from a test by said testable circuit in response to a strobe signal which has the same cycle as said clock signal and a phase difference with respect to said clock signal; and
said test result judging means further comprising:
output signal compression means for receiving the output signal from said latch means and compressing the output signal in synchronization with said clock signal,
output signal expected value generating means for generating an expected value for the response output from said testable circuit with respect to the test signal from said input signal generating means, and outputting a compressed value of said expected value in accordance with the output from said output signal compression means, and
comparator means for comparing the compressed value of the expected value from said output signal expected value generating means with a compressed signal as a test result outputted from said output signal compression means.

11. The semiconductor device as set forth in claim 1 further comprising:
variable delay means for delaying said clock signal for a delay time to change a phase and generate a strobe signal, further comprising:
a selector circuit which receives a test signal from the input signal generating means and a normal signal from a normal input terminal, and supplies the test signal in the test mode and the normal signal in the normal mode to said testable circuit, and
a divider circuit which receives the output signal from said testable circuit, supplies the received output signal in the test mode to said latch means, and outputs the received output signal in the normal mode from a normal output terminal; wherein
said latch means receive and latch a time series output signal resulting from a test by said testable circuit in response to the strobe signal generated by said variable delay means; and
said test result judging means further comprising:
output signal compression means for receiving the output signal from said latch means and compressing the output signal in synchronization with said clock signal,
output signal expected value generating means for generating an expected value for the response output from said testable circuit with respect to the test signal from said input signal generating means, and outputting a compressed value of said expected value in accordance with the output from said output signal compression means, and
comparator means for comparing the compressed value of the expected value from said output signal expected value generating means with a compressed signal as a test result outputted from said output signal compression means.

12. A semiconductor device having a testable circuit that is subjectable to a built-in self-test circuit comprising:
an input signal generating means for generating a test signal in synchronization with a clock signal;
a testing means, the testing means being capable of switching between a test mode for testing and a normal mode,
the testing means supplying said test signal to said testable circuit when in the test mode, and obtaining an output signal from said testable circuit in response to said test signal;
a latch means for extracting, with a specifiable timing, the output signal from said testable circuit that is obtained by said testing means; and
a means for obtaining the output signal of the testable circuit from the latch means.

13. The semiconductor device as set forth in claim 12, wherein the means for obtaining the output signal further comprises:
a test result judging means for obtaining the output signal of said testable circuit from said latch means and comparing the output signal with an expected value for evaluation.

* * * * *